US008823345B2

(12) United States Patent
Shtargot et al.

(10) Patent No.: US 8,823,345 B2
(45) Date of Patent: Sep. 2, 2014

(54) MAGNETIC FIELD CANCELLATION IN SWITCHING REGULATORS

(71) Applicant: Linear Technology Corporation, Milpitas, CA (US)

(72) Inventors: Leonard Shtargot, Campbell, CA (US); Daniel Cheng, Mountain View, CA (US); John Gardner, Berkeley, CA (US); Jeffrey Witt, Oakland, CA (US); Christian Kueck, Luedinghausen (DE)

(73) Assignee: Linear Technology Corporation, Milpitas, CA (US)

( * ) Notice: Subject to any disclaimer, the term of this patent is extended or adjusted under 35 U.S.C. 154(b) by 156 days.

(21) Appl. No.: 13/710,127

(22) Filed: Dec. 10, 2012

(65) Prior Publication Data

US 2014/0111174 A1      Apr. 24, 2014

Related U.S. Application Data

(60) Provisional application No. 61/715,947, filed on Oct. 19, 2012.

(51) Int. Cl.
*H02M 3/158* (2006.01)
*H01L 27/02* (2006.01)
*G05F 1/10* (2006.01)
*H02M 1/44* (2007.01)
*H03K 17/16* (2006.01)

(52) U.S. Cl.
CPC .............. *G05F 1/10* (2013.01); *H01L 27/0207* (2013.01); *H02M 1/44* (2013.01); *H03K 17/161* (2013.01)
USPC ............................ 323/271; 323/282; 327/551

(58) Field of Classification Search
USPC ............. 363/39; 327/551; 257/422; 323/271, 323/272, 282, 350, 351
See application file for complete search history.

(56) References Cited

U.S. PATENT DOCUMENTS

| 7,973,633 B2* | 7/2011 | Noma et al. .................. 336/200 |
| 2010/0038735 A1 | 2/2010 | Li et al. |
| 2011/0128074 A1 | 6/2011 | Nakano |
| 2014/0055117 A1* | 2/2014 | Elwan et al. .................. 323/311 |

OTHER PUBLICATIONS

"AN10912 SMPS EMC and Layout Guidelines", Rev. 1-18 Feb. 2011 Application Note Document Information Info Content, Feb. 18, 2011, XP055102251, <http://www.nxp.com/documents/application_note/AN10912.pdf>.
Extended European Search Report, dated Mar. 5, 2014, 8 pages.
Henry W. Ott, Electromagnetic Compatibility Engineering, Book, Aug. 24, 2009 John Wiley & Sons, Inc., Hoboken, New Jersey, ISBN-10: 0470189304.

* cited by examiner

*Primary Examiner* — Gary L Laxton
(74) *Attorney, Agent, or Firm* — Patent Law Group LLP; Brian D Ogonowsky

(57) ABSTRACT

This invention uses new switching regulator structures to split single magnetic loops into multiple magnetic loops, with linked opposing magnetic fields, to cause a cancelling effect, resulting in a much lower overall magnetic field. This results in lower EMI. In one embodiment, synchronously switched transistors are divided up into parallel topside transistors and parallel bottomside transistors. The topside transistors are positioned to oppose the bottomside transistors, and bypass capacitors are connected between the pairs to create a plurality of current loops. The components are arranged to form a mirror image of the various current loops so that the resulting magnetic fields are in opposite directions and substantially cancel each other out. Creating opposite current loops may also be achieved by forming the conductors and components in a figure 8 pattern with a cross-over point.

27 Claims, 3 Drawing Sheets

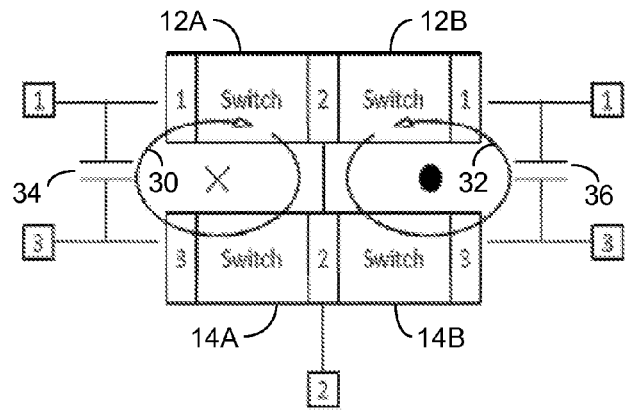
Fig. 3A
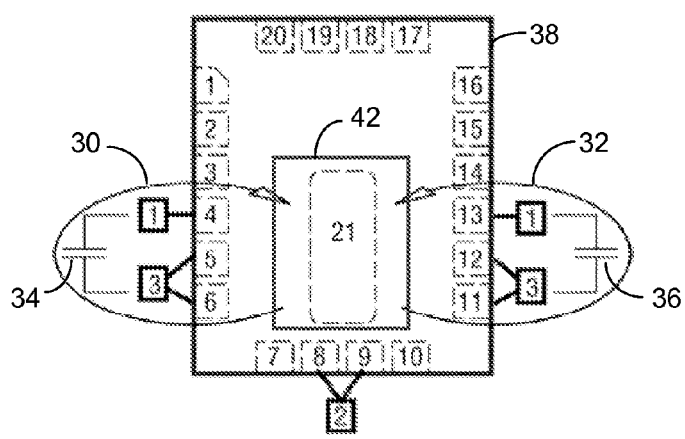
Fig. 3B
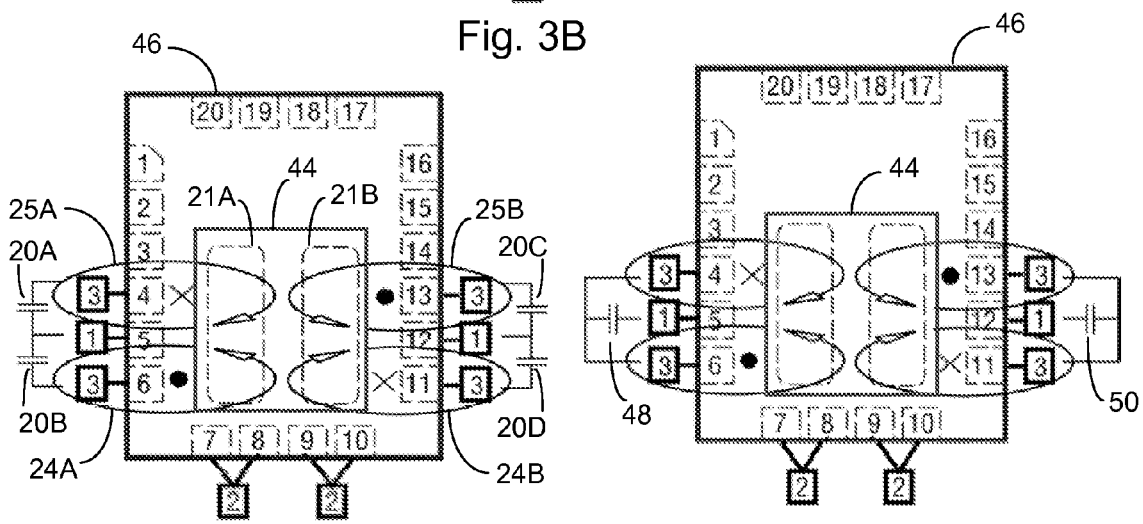
Fig. 4
Fig. 5

MAGNETIC FIELD CANCELLATION IN SWITCHING REGULATORS

CROSS-REFERENCE TO RELATED APPLICATIONS

This application claims priority from provisional application Ser. No. 61/715,947, filed on Oct. 19, 2012, entitled Magnetic Field Cancellation In Switching Regulators, by Leonard Shtargot et al., incorporated herein by reference.

FIELD OF THE INVENTION

This invention relates to switching regulators and, in particular, to a technique to reduce electromagnetic interference (EMI) caused by the magnetic fields created by high frequency switching.

BACKGROUND

Switching regulators typically switch at frequencies from 100 KHz-5 MHz. Small current loops that are created at such high speeds can generate significant magnetic fields. If the switches are formed in an integrated circuit (IC), the current loops may occur entirely within the IC or partially internal and partially external to the IC. If a loop conducts an initial transient current due to the power switch closing or a synchronous rectifier switch closing, the relatively high di/dt results in a high magnetic field that may create electromagnetic interference (EMI).

FIG. 1A illustrates a prior art current loop 10 in a switching power supply, where the entire circuit forming the loop (e.g., transistors, wires/traces, capacitors, parasitics, etc.) adds to the magnetic field, causing EMI. The switches 12 and 14 are shown as MOSFETs, but may be any other type of switch, such as bipolar transistors. The switches 12 and 14 are shown as n-channel MOSFETs, but CMOS transistors may be used, depending on the application. The switches' parasitic capacitances 16 and 18 are shown.

In the example, it is assumed that the switches 12 and 14 are synchronously switched to alternately couple a power supply voltage (Vcc) at terminal 1 to the output terminal 2 and then couple a ground voltage at terminal 3 to the output terminal 2. An inductor (not shown) may be coupled to terminal 2 as part of an output circuit 17 in a buck regulator. In one example of a regulator, a PWM controller IC 19 is connected to the gates of the two switches 12 and 14 for controlling the switch duty cycle to output a regulated voltage Vout or regulated current. The duty cycle is controlled to cause a feedback voltage Vfb, proportional to the output voltage of the regulator, to match a reference voltage. One of the switches is referred to as the power switch and the other is the synchronous rectifier, which essentially acts as a low voltage drop diode. The switches 12 and 14 are not both on at the same time to avoid a short circuit.

The regulator may be any type (e.g., buck, boost, flyback, etc), and the particular connection of the switches 12 and 14 to the inductor is determined by the type of regulator. The present invention may be employed in any type of switching regulator, and certain examples are given to illustrate the concepts of the invention as applied to a standard buck regulator switching configuration.

A conventional bypass capacitor 20 is shown in FIG. 1A connected between terminal 1 and terminal 3. Bypass capacitors are typically used in prior art switching circuits. If we assume terminal 1 is connected to Vcc and terminal 3 is ground, the bypass capacitor 20 smooths transients when the switches 12 and 14 open and close. For example, when the regulator controller closes the switch 12 to charge the inductor, there is a surge of current by the charged capacitor 20 being connected to the inductor via terminal 2. This helps offset any droop in the Vcc caused by the surge of current and smooths the switching transient. The capacitor 20 forms part of the current loop around terminals 2, 3, and 1. The parasitic capacitances 16 and 18 of the switches 12 and 14 are also part of the current loop, and the parasitic capacitor 18 charges when the switch 14 is turned off and the switch 12 is turned on.

As seen, there is a very fast and high current pulse (having a large di/dt) being generated through the loop 10 at the switching frequency. This pulse generates EMI, which may interfere with or create distortion in nearby electrical circuits.

The switches 12 and 14 may be within an IC 21 and may be part of the PWM controller IC 19.

FIG. 1B is another representation of the circuit of FIG. 1A, which illustrates the transistor switch locations on a printed circuit board (PCB) or in an IC package. The terminals 1, 2, and 3 may be the connection nodes for the pins extending from the IC package. The current loop 10 shows the transient current flowing in a counter-clockwise direction, causing the direction of the magnetic field to be upwards, represented by a dot. The magnetic field emanates in all directions in a certain pattern.

What is needed is a technique for reducing the overall magnetic field generated by a switching regulator in order to reduce EMI.

SUMMARY

The invention is a switching regulator that generates a greatly reduced overall magnetic field, where the magnetic field is associated with quickly changing switch currents.

The inventive technique splits the prior art single magnetic loop into multiple magnetic loops (each incorporating a high frequency switch), where the multiple loops have linked opposing magnetic fields that cancel each other out, resulting in a much lower overall magnetic field and EMI compared to prior art designs.

The magnetic field cancellation techniques of the invention are applicable to both planar and 3-dimensional (3-D) switching circuits in switch mode power supplies. Planar construction includes integrated circuits and printed circuit boards. 3-D construction includes stacked (vertically oriented) loop components, stacked integrated circuit elements, and stacked printed circuit boards.

In one embodiment, a topside power switch and synchronous rectifier switch (the bottomside switch) are divided and arranged as follows. The bottomside switch is divided into two identical bottomside switches operated in parallel, and the bottomside switches are arranged on opposite sides of the topside switch, in a planar embodiment. A first bypass capacitor is connected between the first bottomside switch and the topside switch, and a second bypass capacitor is connected between the second bottomside switch and the topside switch. The configurations are essentially mirror images, with the topside switch in the middle. If we assume the topside switch has just been turned on, the current loop through the topside switch and the first bottomside switch is counter-clockwise, and the current loop through the topside switch and the second bottomside switch is clockwise. The directions of the two magnetic fields created are opposite. Since the loops are very close, the generated magnetic fields substantially cancel out, so the overall magnetic field emanating from the regulator is greatly reduced, reducing EMI.

The technique may be applied to also dividing up the topside switch, where a first pair of topside and bottomside switches creates a first current loop in one direction, and a second pair of topside and bottomside switches creates a second current loop in the opposite direction to produce cancelling magnetic fields.

In another embodiment, the topside switch and bottom side switch are divided up into four bottomside switches and two topside switches that form four current loops that oppose each other in the x and y directions to create an even lower overall magnetic field.

Similar techniques may be used for 3-D configurations where the opposing current loops are vertically oriented. For example, the bypass capacitor may be located overlying the switches.

Further, the switches may be stacked or the PCBs may be stacked to cancel out the magnetic fields produced by each level.

In another embodiment a single current path is formed in a figure 8 shape to create two opposing current loops, resulting in the cancellation of the magnetic fields.

Other embodiments are envisioned.

BRIEF DESCRIPTION OF THE DRAWINGS

FIG. 3A illustrates another configuration of switches that further reduces EMI yet accomplishes the switching function of the circuit of FIG. 1A.

FIG. 3B is a semi-transparent top down view of a package for one or more ICs, showing the package pin layout and the pins corresponding to the terminals in FIG. 3A.

FIG. 4 is a semi-transparent top down view of a package for an IC, showing the package pin layout and the pins corresponding to the terminals in a switch configuration, where the three switches of FIG. 2B have been divided into a total of six switches and positioned as mirror images in the package to further reduce EMI.

FIG. 5 has the same switch arrangement as FIG. 4 but a different bypass capacitor connection, saving two capacitors while maintaining reduced EMI.

FIG. 7A is a side view from the upper side of FIG. 7B.

FIG. 8A is a side view from the upper side of FIG. 8B.

In the figures, elements that are the same or equivalent are labeled with the same numeral.

DETAILED DESCRIPTION

In all embodiments, the gates of the MOSFET switches are assumed to be connected to a conventional synchronous PWM controller for a DC-DC converter, and a conventional output circuit is connected to the terminals 1, 2, and 3, as needed for the particular type of converter. The output circuit typically comprises one or more inductors and one or more large smoothing capacitors. The datasheet for the LT8611 Synchronous Step-Down Regulator, available on-line from the Linear Technology Corporation website, illustrates a suitable PWM controller for the switches described herein, as well as an output circuit, and is incorporated herein by reference as a typical example of a PWM controller and output circuit for synchronous switches. Other suitable PWM controllers and output circuits are described in U.S. Pat. Nos. 5,731,731 and 5,847,554, assigned to the present assignee and incorporated herein by reference. The controllers may switch at a fixed frequency or a variable frequency.

In accordance with the present invention, magnetic loop cancellation in planar structures is accomplished by dividing the switches into multiple switch portions and electrically interconnecting them to create a plurality of similar current loops but having opposite directions. This configuration places opposing magnetic fields in close proximity to achieve an overall lower magnetic field emanation. In a vertical structure, one or more components (such as the wires/traces or the bypass capacitor) in the current loops are above the IC or PCB surface to create opposite vertical current loops to achieve an overall lower magnetic field.

Figure 1A:
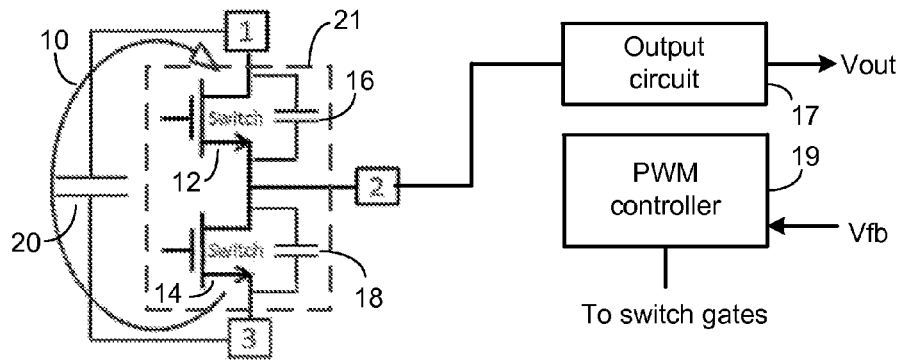
FIG. 1A illustrates a prior art switching circuit used in conventional switching regulators.
Figure 1B:
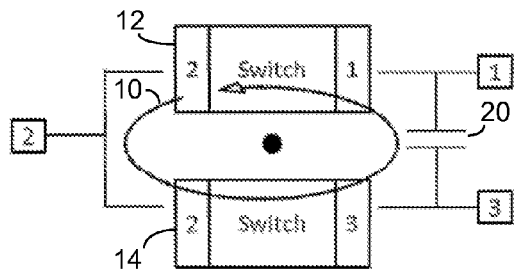
FIG. 1B is a different representation of FIG. 1A, showing locations of the transistor switches on an IC or PCB.
Figure 2A:
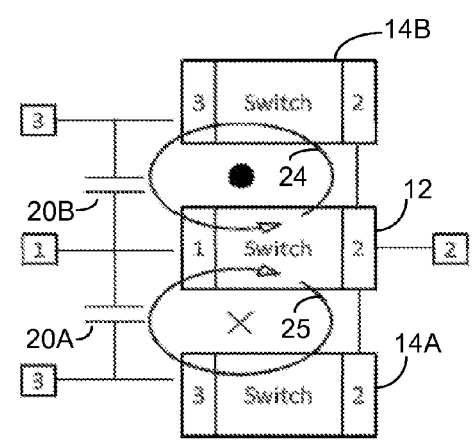
FIG. 2A illustrates a switching configuration that accomplishes the switching function of the circuit of FIG. 1A but with much less EMI.

FIG. 2A illustrates how the switching circuit of FIG. 1A can be broken up into multiple loops that conduct current in opposite directions, causing the magnetic fields to have opposite directions (shown by the dot and x) to partially cancel out the magnetic fields created by each loop. Therefore, the overall magnetic field emitted by the circuit is reduced. Magnetic field cancellations of 50% and higher can be obtained for a planar construction.

In FIG. 2A, the bottom switch 14 in FIG. 1A is replaced by two switches 14A and 14B in parallel, and the two switches sandwich the other switch 12 (the high side switch) in the plane. The opposing current loops 24 and 25 are placed as close together as practical on the chip or PCB to improve the cancellation. The bypass capacitor 20 in FIG. 1A is replaced by bypass capacitors 20A and 20B to perform the same function as the bypass capacitor 20. The switches 14A and 14B may each be half the size of the switch 14, so there is not a large increase in size. The switches 14A and 14B may be MOSFETs, bipolar transistors, or any other switching elements controlled by the switching regulator controller IC 19, and the switches may be on the PWM controller IC 19. The terminal 2 may be connected to the output circuit 17 of FIG. 1A.

FIG. 2A illustrates a planar circuit construction. Magnetic field cancellation may also be achieved by creating a 3-D structure, described later.

Figure 2B:
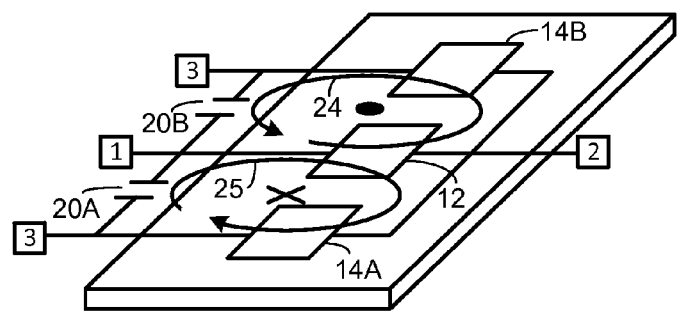
FIG. 2B is a perspective view of a portion of an IC or PCB presenting a different representation of FIG. 2A, showing locations of the transistor switches on the IC or PCB.

FIG. 2B illustrates the layout of the switches of FIG. 2A on an IC 28, which may also contain the control circuitry.

All bypass capacitors in all embodiments may be located internal to the package or external to the package. Providing the capacitors internal to the package better ensures the symmetrical relationships of the opposite magnetic fields for optimal cancellation.

Although, synchronously switch transistors are used in the example, other types of switching regulators may turn off both switches concurrently, such as in a sleep mode of operation or a discontinuous mode. The synchronous rectifier switch may be controlled by a reverse voltage detection circuit rather than being synchronously switched with the other switch.

FIG. 3A illustrates another example of how the switching circuit of FIG. 1A can be broken up to create multiple current loops 30/32 that conduct current in opposite directions, causing the magnetic fields to have opposite directions or polarities (shown by the dot and x) to partially cancel out the magnetic fields created by each loop. The bypass capacitors 34 and 36 are also shown as part of each loop. In FIG. 3A, the bottom switch 14 in FIG. 1A is replaced by two switches 14A and 14B connected in parallel, and the top switch 12 in FIG. 1A is replaced by two switches 12A and 12B connected in parallel. The circuit is laid out on the PCB or in silicon so the opposite direction loops are placed as close together as practical to improve the cancellation. Each switch (e.g., a MOSFET) may be half the size as the prior art switch to achieve the same power handling specification, since the two MOSFETs are connected in parallel. So the resulting size is not significantly increased.

FIG. 3B is a semi-transparent top down view of a package 38 for one or more ICs, showing the package pin layout and the pins corresponding to the terminals 1, 2, and 3 in FIG. 3A. The terminals 1, 2, and 3 may be connection nodes on a PCB. The package has 20 peripheral pins and a center ground pad 21 for connection to a ground pin or a pad on the PCB. The outline of an IC 42 is shown, which contains the two sets of switches in FIG. 3A. The terminals on the IC 42 may be connected to the pins of the package 38 by bond wires, a lead frame, a PCB, or other connectors. Multiple terminals and pins may be connected together to handle higher currents and/or to create a desirable current loop pattern.

The magnetic field cancellation in FIGS. 2B and 3B is different in the x and y directions, due to the asymmetry of the structure. To create a more symmetrical cancellation structure, the configuration of FIG. 4 may be used.

In FIG. 4, an outline of an IC 44 is shown along with exposed pads 21A and 21B. The IC 44 contains six switches, where a mirror image of the switch configuration in FIG. 2B is created by dividing the switches 14A, 14B, and 12 to create the equal but opposite current loops 24A and 25B, and 24B and 25B. Additional bypass capacitors 24B and 25B are connected to the terminals 1 and 3. The resulting magnetic fields symmetrically cancel each other out to lower EMI in all directions. The terminals 1, 2, and 3 (e.g., nodes on a PCB for connection to the power supply and bypass capacitors) should be close to the associated package pins (pins 4-13) to create four similar current loop structures. The selection of the package pins (forming part of the current loops) is thus important to create current loops with similar shapes that are very close together.

Pins may be tied together to reduce resistance and to help cancel the magnetic fields.

FIG. 5 illustrates another circuit arrangement, using the same package 46 and IC 44 in FIG. 4, where only two bypass capacitors 48 and 50 are used. The opposing current loops 24A and 25B, and 24B and 25B, can each share a bypass capacitor 48 or 50.

Each bypass capacitor in FIG. 5 (48 or 50) is optimally placed symmetrically between its associated outer switches (e.g., switches 14A and 14B in FIG. 2B) so as to be substantially equidistant from each associated outer switch to equalize the opposite magnetic fields.

The combination of the switch configuration, the bypass capacitor configuration, the wiring from the package to the IC leads, any internal traces in the package, the metal conductor configuration in the IC, the IC/package terminal/pin arrangement, and the PCB traces all must be considered to achieve the maximum amount of magnetic field cancelling.

In all embodiments, the switches do not have to be formed on the same silicon chip, and multiple silicon chips may be interconnected within a single package, where the interconnections (e.g., wires or traces) are part of the current loop.

The goal of the various switch/capacitor arrangements is to provide a minimum of two current paths generating similar but opposite magnetic field properties. This may be accomplished in ways other than those described with respect to FIGS. 2A-5. FIGS. 6-8B illustrate a few of those other ways.

Figure 6:
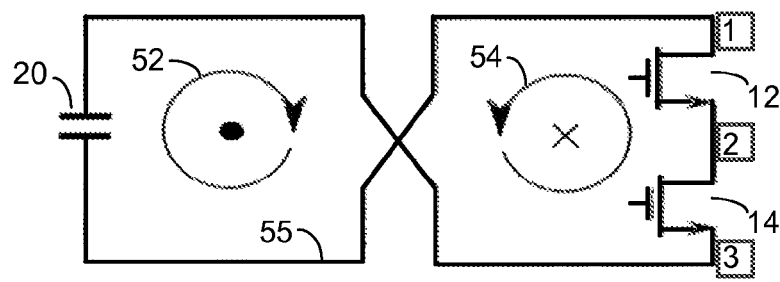
FIG. 6 illustrates how cross-over wiring in a figure 8 shape may create opposite current loops.

FIG. 6 illustrates a cross-wiring configuration for the switches 12 and 14, connected to the bypass capacitor 20, that creates opposing current loops 52 and 54 in the IC or PCB for reducing the overall magnetic field generated. The cancellation current loop forms a figure 8 shape, which includes rounded figure 8 shapes as well as rectilinear figure 8 shapes. The two or more opposite current loops are made by crossing the wires 55 or traces with an insulating layer in-between. The wires/traces 55 may be internal or external to the IC or partially internal and external.

The bypass capacitor 20 can be at any position in the current loop, such as at the crossing point. The crossing point can then be placed under the capacitor.

Figure 7A:
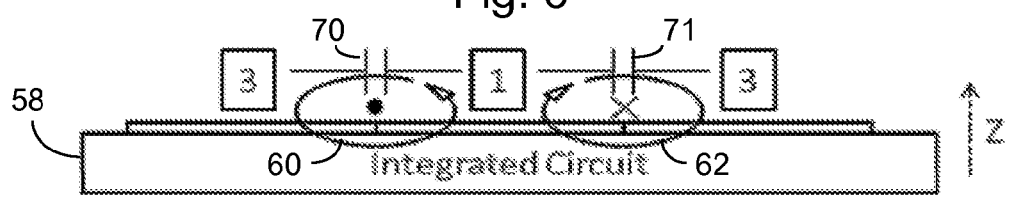
FIG. 7A is a side view of an IC containing six switches, such as the switches of FIG. 4, where the bypass capacitors are stacked above the transistors to form opposite vertical current loops to reduce EMI.
Figure 7B:
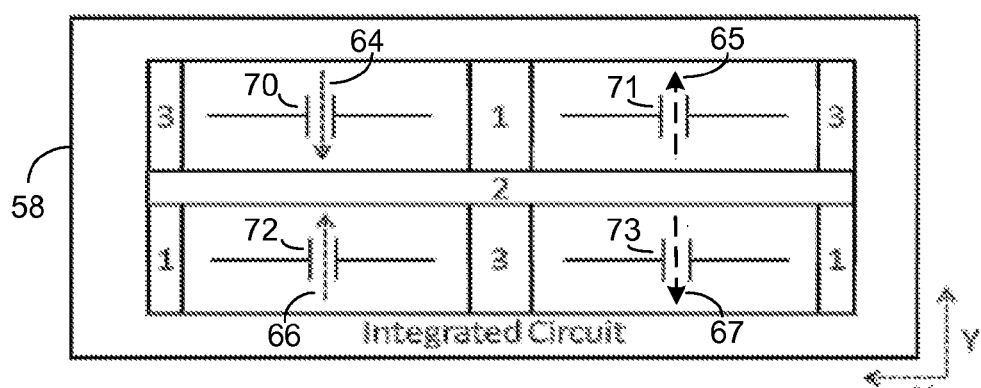
FIG. 7B is a top down view of the IC of FIG. 7A, where

FIGS. 7A and 7B illustrate a side view and top down view, respectively, of a circuit configuration in an IC 58 where the opposing current loops 60 and 62 have a vertical component for cancelling out the magnetic fields 64, 65, 66, and 67 in FIG. 7B. The directions of the magnetic fields are shown by arrows. The magnetic field cancellation is formed by attaching bypass capacitors 70, 71, 72, and 72 over the IC 58 to create vertical current loops, rather than planar loops. There are four vertical current loops created using six switches which cancel the magnetic field in all directions. The six switches comprise the topside switch divided into three parallel switches and the bottomside switch divided into three parallel switches in the arrangement indicated in FIG. 7B. Note how the top half of FIG. 7B has two bottomside switches (coupled to the terminals 3 and 2) sandwiching the central topside switch (coupled to terminals 1 and 2), and the bottom half of FIG. 7B has two topside switches (coupled to the terminals 1 and 2) sandwiching the central bottomside switch (coupled to terminals 3 and 2) to form an asymmetrical arrangement.

Figure 8A:
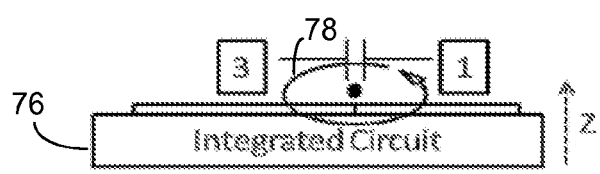
FIG. 8A is a side view of an IC containing four switches, where the bypass capacitors are stacked above the transistors to form opposite vertical current loops to reduce EMI.
Figure 8B:
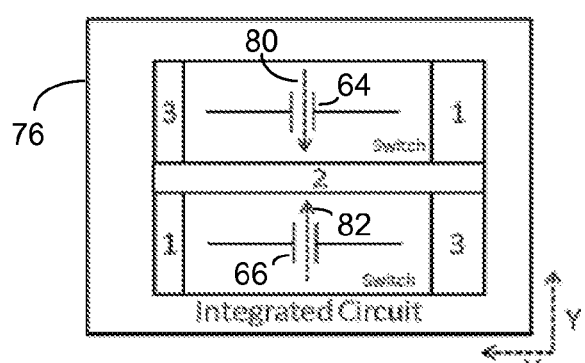
FIG. 8B is a top down view of the IC of FIG. 8A, where

FIGS. 8A and 8B illustrates a side view and top down view of another embodiment of vertical circuits in an IC 76 with opposite-direction current loops 78 (only one current loop is shown in FIG. 8A) for cancelling out the magnetic fields 80 and 82 in FIG. 8B. In FIG. 8B, there are four switches, where the topside switch is divided into two parallel switches, and the bottomside switch is divided into two parallel switches in the arrangement indicated in FIG. 8B. FIG. 8B is essential the left half of the circuit of FIG. 7B, where, in FIG. 8B, each switch is larger to carry half the current.

Generally, magnetic loop cancellation in a 3-D construction is formed by forming multiple power switch devices with paths for circulating current in a vertically oriented mirror image configuration. The structure is designed to crate opposing loops of current to generate antiparallel magnetic fields for a cancellation effect.

Close proximity of the loops, such as in the same IC package, have better cancellation but even a larger distance still improves cancellation compared to prior art single loop designs.

In the various embodiments described, the overall magnetic field induced due to net currents flowing through two or more cancelling current loops is less than the sum of the absolute magnetic fields of the individual loops or a comparable loop of a prior art single loop design in any plane cutting through the 2 or 3 dimensional cancellation design. Accordingly, there is less EMI by using the techniques of the present invention.

Although, in the various embodiments, the magnitudes of the opposing magnetic fields have been identical, the invention still operates to lower EMI to a lesser degree even when the opposing magnetic fields have different magnitudes, such as where the current loops have different loop radii or shapes.

The same cancellation that lowers EMI also results in lower parasitic inductances, which are a loss mechanism at high switching frequencies. Therefore, the present cancellation technique results more efficient power supplies at high switching frequencies compared to the prior art. This is an unexpected and surprising result of the magnetic field cancellation technique.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A switching regulator circuit comprising:
   a controller for generating transistor switch control signals;
   at least a first switch controlled by the controller, wherein a duty cycle of the first switch controls a regulated output of the switching regulator circuit;
   a first bypass capacitor coupled to the first switch; and
   at least a first current loop and a second current loop being simultaneously created by switching of the first switch, wherein a first current flows in the first current loop in a first direction to generate a first magnetic field having a first magnitude in a first direction, wherein a second current flows in the second current loop in a second direction, opposite to the first direction, to generate a second magnetic field having a second magnitude in a second direction, such that the first magnetic field and the second magnetic field combine to reduce electromagnetic interference (EMI) generated by the switching regulator circuit.

2. The circuit of claim 1 wherein first magnitude is approximately the same as the second magnitude.

3. The circuit of claim 1 further comprising:
   a first conductor connected between a first terminal of the first switch and a first terminal of the first bypass capacitor; and
   a second conductor connected between a second terminal of the first bypass capacitor and a reference voltage,
   wherein the first conductor and the second conductor cross over one another to form a figure 8 shape forming the first current loop and the second current loop conducting currents in opposite directions.

4. The circuit of claim 3 wherein the figure 8 shape is constructed by forming the cross over point underneath the first bypass capacitor.

5. The circuit of claim 1 wherein the first switch comprises a third switch and a fourth switch connected in parallel so as to conduct simultaneously, the circuit further comprising:
   a second switch,
   wherein the third switch and the fourth switch are located on opposite sides of the second switch such that the first current loop is created by the first current flowing into the third switch and the second switch, and the second current loop is created by the second current flowing into the fourth switch and the second switch.

6. The circuit of claim 5 wherein, when the third switch and fourth switch are on and the second switch is off, the first current flows through the third switch and into a parasitic capacitor of the second switch, and the second current flows through the fourth switch and into the parasitic capacitor of the second switch.

7. The circuit of claim 5 wherein the first bypass capacitor is coupled between the second switch and the third switch, and wherein the first bypass capacitor is part of the first current loop.

8. The circuit of claim 7 further comprising a second bypass capacitor coupled between the second switch and the fourth switch, and wherein the second bypass capacitor is part of the second current loop.

9. The circuit of claim 7 wherein the first bypass capacitor is also coupled between the second switch and the fourth switch, and wherein the first bypass capacitor is also part of the second current loop.

10. The circuit of claim 9 wherein the first bypass capacitor is placed symmetrically between the third switch and the fourth switch so as to be substantially equidistant from the third switch and the fourth switch.

11. The circuit of claim 1 wherein the first switch comprises a third switch and a fourth switch connected in parallel so as to conduct simultaneously, the circuit further comprising:
    a second switch,
    wherein the second switch comprises a fifth switch and a sixth switch connected in parallel so as to conduct simultaneously, wherein the fifth switch is positioned opposing the third switch, wherein the sixth switch is positioned opposing the fourth switch, wherein the sixth switch is next to the fifth switch, and wherein the third switch is next to the fourth switch, such that the first current loop is created by the first current flowing into the third switch and the fifth switch, and the second current loop is created by the second current flowing into the fourth switch and the sixth switch.

12. The circuit of claim 11 wherein, when the third switch and fourth switch are on, and when the fifth switch and sixth switch are off, the first current flows through the third switch and into a parasitic capacitor of the fifth switch, and the second current flows through the fourth switch and into the parasitic capacitor of the sixth switch.

13. The circuit of claim 11 wherein the first bypass capacitor is coupled between the fifth switch and the third switch, and wherein the first bypass capacitor is part of the first current loop.

14. The circuit of claim 13 further comprising a second bypass capacitor coupled between the sixth switch and the fourth switch, and wherein the second bypass capacitor is part of the second current loop.

15. The circuit of claim 1 wherein the first switch comprises a plurality of first switch portions connected in parallel so as to be switched simultaneously, the circuit further comprising:
    a second switch, wherein the second switch comprises a plurality of second switch portions connected in parallel so as to be switched simultaneously;
    wherein the first switch portions are positioned to oppose the second switch portions to create opposing pairs of first switch portions and second switch portions,
    wherein the opposing pairs create a plurality of current loops, including the first current loop and the second current loop, wherein some current loops flow in a direction opposite to other ones of the current loops to create a plurality of magnetic fields having opposite directions to reduce EMI generated by the switching regulator circuit.

16. The circuit of claim 15 further comprising a plurality of bypass capacitors, including the first bypass capacitor, wherein associated ones of the bypass capacitors are coupled between the first switch portions and the second switch portions to form the current loops.

17. The circuit of claim 16 wherein at least four current loops are created comprising the first current loop and the second current loop, and a third current loop and a fourth current loop, wherein a direction of current in the third current loop is opposite a direction of current in the fourth current loop.

18. The circuit of claim 1 wherein the first current loop and the second current loop are planar, substantially parallel to a surface of a substrate on which the first switch and the second switch are formed.

19. The circuit of claim 1 wherein the first current loop and the second current loop have vertical components that are non-planar with respect to a surface of a substrate on which the first switch and the second switch are formed.

20. The circuit of claim 19 wherein the first bypass capacitor is non-planar with the first switch and the second switch.

21. The circuit of claim 1 wherein the first switch and the second switch are MOSFETs.

22. The circuit of claim 1 wherein the first switch and the second switch are formed on an integrated circuit chip.

23. The circuit of claim 22 wherein the integrated circuit chip has alternating or interleaved external terminals to the first switch and the second switch.

24. The circuit of claim 22 wherein the integrated circuit chip has two sets of external terminals to the first switch and the second switch, one set on each side of the integrated circuit package.

25. The circuit of claim 22 wherein the integrated circuit chip utilizes a plurality of capacitors external to an integrated circuit package housing the chip to connect to all or a subset of the terminals of the first switch and the second switch.

26. The circuit of claim 22 wherein the integrated circuit chip utilizes a plurality of capacitors internal to an integrated circuit package housing the chip to connect to the first switch and the second switch in several locations.

27. The circuit of claim 1 wherein the first switch and the second switch are housed in a same package having terminals, where the terminals are arranged on the package such that, when the first bypass capacitor is connected to the terminals external the package, the first current loop and the second current loop are formed.

* * * * *